(12) United States Patent
Sakazaki et al.

(10) Patent No.: US 12,371,796 B2
(45) Date of Patent: Jul. 29, 2025

(54) SUBSTRATE PROCESSING APPARATUS, SUBSTRATE PROCESSING METHOD, AND CHEMICAL LIQUID

(71) Applicant: Tokyo Electron Limited, Tokyo (JP)

(72) Inventors: Tetsuya Sakazaki, Kumamoto (JP); Hitoshi Kosugi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 387 days.

(21) Appl. No.: 17/973,799

(22) Filed: Oct. 26, 2022

(65) Prior Publication Data

US 2023/0041889 A1 Feb. 9, 2023

Related U.S. Application Data

(62) Division of application No. 17/154,049, filed on Jan. 21, 2021, now Pat. No. 11,545,367.

(30) Foreign Application Priority Data

Jan. 23, 2020 (JP) .................. 2020-009326
Sep. 30, 2020 (JP) .................. 2020-165067

(51) Int. Cl.
*C23F 1/00* (2006.01)
*C23F 1/44* (2006.01)
*H01L 21/306* (2006.01)
*H01L 21/311* (2006.01)
*H01L 21/3213* (2006.01)
*H01L 21/67* (2006.01)

(52) U.S. Cl.
CPC .................. *C23F 1/00* (2013.01); *C23F 1/44* (2013.01); *H01L 21/30604* (2013.01); *H01L 21/311* (2013.01); *H01L 21/31111* (2013.01); *H01L 21/32134* (2013.01); *H01L 21/67028* (2013.01); *H01L 21/67051* (2013.01); *H01L 21/67075* (2013.01); *H01L 21/6708* (2013.01)

(58) Field of Classification Search
None
See application file for complete search history.

(56) References Cited

U.S. PATENT DOCUMENTS 6,332,723 B1* 12/2001 Matsuyama .......... G03F 7/3021
                                                                396/611
8,815,111 B2    8/2014 Nakamura
2005/0056616 A1* 3/2005 Cooper ............ H01L 21/32134
                                                                257/E21.309

(Continued)

FOREIGN PATENT DOCUMENTS

CN          1607268 A       4/2005
JP       2006147654 A       6/2006
(Continued)

*Primary Examiner* — Jiong-Ping Lu
(74) *Attorney, Agent, or Firm* — Venjuris, P.C.

(57) ABSTRACT

A substrate processing method includes: supplying a first processing liquid containing a chelating agent and a solvent from a first tank toward a substrate having a film of a metal formed on a surface thereof to generate a complex containing the metal and the chelating agent while rotating the substrate; and supplying a second processing liquid containing water toward the substrate to dissolve the complex in the second processing liquid while rotating the substrate, after the complex is generated.

11 Claims, 6 Drawing Sheets

(56) References Cited

U.S. PATENT DOCUMENTS

2016/0372340 A1   12/2016  Takeaki et al.
2020/0157693 A1*  5/2020  Abel .......................... C23F 1/02

FOREIGN PATENT DOCUMENTS

| JP | 2018-181984 A | 11/2018 |
|---|---|---|
| TW | 201708613 A | 3/2017 |
| WO | 2019235275 A1 | 12/2019 |

* cited by examiner

SUBSTRATE PROCESSING APPARATUS, SUBSTRATE PROCESSING METHOD, AND CHEMICAL LIQUID

CROSS-REFERENCE TO RELATED APPLICATIONS

This application is a divisional application of U.S. patent application Ser. No. 17/154,049, filed on Jan. 21, 2021, which claims priority from Japanese Patent Application Nos. 2020-009326 and 2020-165067, filed on Jan. 23, 2020 and Sep. 30, 2020, respectively, with the Japan Patent Office, all of which are incorporated herein in their entireties by reference.

TECHNICAL FIELD

The present disclosure relates to a substrate processing apparatus, a substrate processing method, and a chemical liquid.

BACKGROUND

In a semiconductor manufacturing process, an etching method has been known in which a part of a metal film formed on a substrate such as a semiconductor wafer is removed by supplying an etching liquid which contains a chelating agent and has a pH of 7 or more to the metal film (see, e.g., Japanese Patent Laid-Open Publication No. 2018-181984).

SUMMARY

A substrate processing apparatus according to one aspect of the present disclosure includes a substrate rotator configured to hold and rotate a substrate including a film of a metal formed on a surface thereof, a first supply configured to supply a first processing liquid containing a chelating agent and a solvent toward the substrate, a second supply configured to supply a second processing liquid containing water toward the substrate, and a controller configured to control the substrate rotator, the first supply, and the second supply. While rotating the substrate by the substrate rotator, the controller supplies the first processing liquid toward the substrate by the first supply to generate a complex containing the metal and the chelating agent, and after the complex is generated, supplies the second processing liquid toward the substrate by the second supply to dissolve the complex in the second processing liquid.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1A:
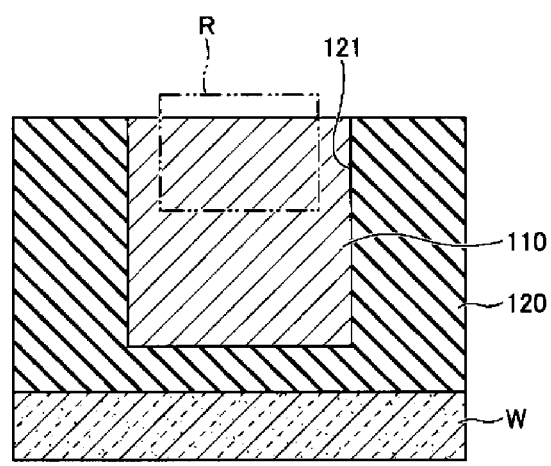
FIGS. 1A and 1B are explanatory diagrams of an outline of a substrate processing method according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, an embodiment of the present disclosure will be described with reference to the drawings. In each drawing, the same or corresponding components will be designated by the same or corresponding reference numerals and descriptions thereof will be omitted.

1. Substrate Processing Method

Figure 1B:
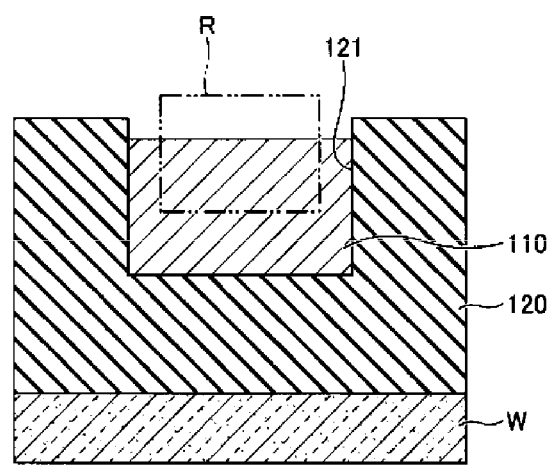

First, an outline of a substrate processing method according to an embodiment will be described with reference to FIGS. 1A and 1B. FIGS. 1A and 1B are explanatory diagrams of an outline of a substrate processing method according to an embodiment.

As illustrated in FIGS. 1A and 1B, the substrate processing method according to the embodiment is a method of thinning a metal film 110 formed on a substrate (hereinafter, referred to as wafer W) such as a semiconductor wafer by removing a part of the metal film 110. The metal film 110 is provided inside a recess 121 such as a wiring groove or via hole formed in an interlayer insulating film 120. The interlayer insulating film 120 is, for example, a low dielectric constant film (low-k film), and is formed on the surface of the wafer W. For example, before a processing, the surface of the metal film 110 is flush with the surface of the interlayer insulating film 120 as illustrated in FIG. 1A, and after a processing, the surface of the metal film 110 is located closer to the wafer W than the surface of the interlayer insulating film 120 as illustrated in FIG. 1B. The substrate processing method of the present disclosure is not limited to the method of thinning the metal film 110 in the recess 121 as in the present embodiment, and may be used, for example, for precise etching of the entire surface of the wafer W.

Next, details of the substrate processing method according to the embodiment will be described with reference to FIGS. 2A to 2E. FIGS. 2A to 2E are explanatory diagrams of details of the substrate processing method according to the embodiment. FIGS. 2A to 2E illustrates a change in the region R indicated by the two-dot dash line in FIGS. 1A and 1B.

Figure 2A:
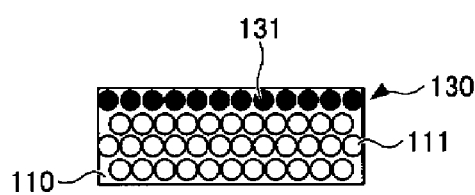
FIGS. 2A to 2E are explanatory diagrams of details of the substrate processing method according to the embodiment.
Figure 2B:
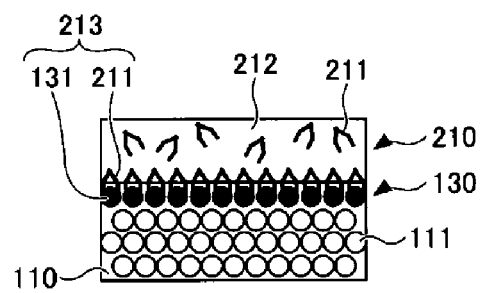

In the substrate processing method according to the embodiment, first, a first processing liquid containing a chelating agent and a solvent is supplied to the metal film 110. As illustrated in FIG. 2A, the metal film 110 contains metal atoms 111, and a passivation film 130 made of, for example, an oxide 131 of the metal atoms 111 is formed on the surface of the metal film 110. For example, the passivation film 130 illustrated in FIG. 2A is a natural oxide film, and has a thickness equivalent to one atomic layer of the metal atoms 111. By supplying a first processing liquid 210 containing a chelating agent 211 and a solvent 212 to the metal film 110, a part of the chelating agent 211 adheres to the oxide 131 to generate a complex 213 containing the oxide 131 and the chelating agent 211, as illustrated in FIG. 2B. Since the oxide 131 contains the metal atoms 111, the complex 213 contains the metal atoms 111 and the chelating agent 211. The complex 213 is difficult to be dissolved in the solvent 212.

Figure 2C:
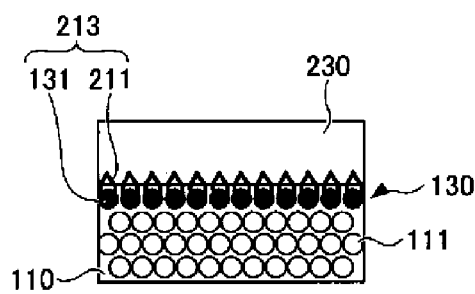

Subsequently, as illustrated in FIG. 2C, a third processing liquid 230 that is water soluble is supplied to the metal film 110. As a result, the complex 213 continues to remain on the metal film 110 as it is, and the chelating agent 211 that did not adhere to the oxide 131 and the solvent 212 are replaced by the third processing liquid 230.

Figure 2D:
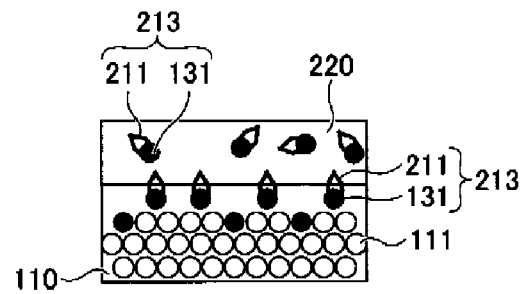

Subsequently, as illustrated in FIG. 2D, a second processing liquid 220 containing water is supplied to the metal film 110. As a result, the complex 213 is dissolved in the second processing liquid 220. The second processing liquid 220 inevitably contains dissolved oxygen. Therefore, when the complex 213 is dissolved in the second processing liquid 220, the metal atoms 111 located immediately below the dissolved complex 213 are oxidized by the dissolved oxygen, and a new oxide 131 starts to be generated.

Figure 2E:
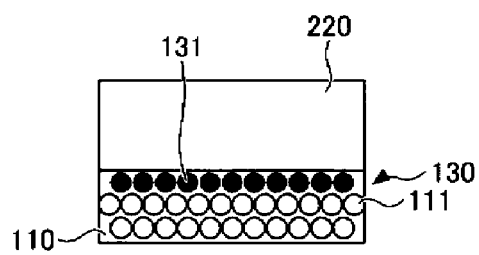

When all of the complex 213 is dissolved in the second processing liquid 220, as illustrated in FIG. 2E, a new passivation film 130 made of the new oxide 131 is formed on the entire surface of the metal film 110. Further, the complex 213 is dissolved in the second processing liquid 220 and removed from the metal film 110.

In this way, the atomic layer of the metal atoms 111 may be removed from the metal film 110 one by one. Further, by repeating the processing from the supply of the first processing liquid 210 (FIG. 2B) to the removal of the complex 213 (FIG. 2E), the atomic layer is removed from the metal film 110 one by one, which may allow the metal film 110 to be thinned by a plurality of atomic layers of the metal atoms 111.

Then, when the metal film 110 becomes thinner by a predetermined thickness, the supply of all of the first processing liquid 210, the second processing liquid 220, and the third processing liquid 230 is stopped, and the wafer W is rotated to achieve the drying of the wafer W.

With the substrate processing method according to the embodiment, it is possible to suppress the surface roughness of the metal film 110 after etching. In other words, the metal film 110 may be thinned while maintaining the surface of the metal film 110 flat (see FIG. 1B).

The wafer W may be dried between the removal of the complex 213 (FIG. 2E) and the next supply of the first processing liquid 210 (FIG. 2B). Even when the passivation film 130 is not sufficiently formed when the complex 213 is dissolved in the second processing liquid 220, the formation of the passivation film 130 may be promoted by drying the wafer W.

Further, light etching of the metal film 110 may be performed as a pretreatment before the first supply of the first processing liquid 210 (FIG. 2B). The pretreatment may be performed by using, for example, a fourth processing liquid to remove foreign substances such as organic matters adhering to the surface of the passivation film 130. By removing the foreign substances in advance, it becomes easier to keep the surface of the metal film 110 flat.

The chelating agent 211 contained in the first processing liquid 210 contains, for example, an organic acid containing one or more selected from the group consisting of a carbonyl group, a carboxyl group, and an amine group. Examples of such an organic acid include citric acid, oxalic acid, malic acid, maleic acid, iminodiacetic acid and ethylenediaminetetraacetic acid (EDTA). The chelating agent 211 contained in the first processing liquid 210 may be a chelating agent capable of coordinating with the oxide 131 of a metal (target metal) constituting the metal film 110 which is a processing target. Examples of the chelating agent 211 may include citric acid and oxalic acid which may be used when the target metal is cobalt, and oxalic acid which may be used when the target metal is copper.

Examples of the solvent 212 contained in the first processing liquid 210 may include isopropyl alcohol (IPA). The solvent 212 may contain one or more selected from the group consisting of isopropyl alcohol, acetone, N-methyl-2-pyrrolidone (NMP), and tetrahydrofuran.

The first processing liquid 210 may contain water in addition to the chelating agent 211 and the solvent 212, but the content of water in the first processing liquid 210 may be preferably 10 mass % or less, and more preferably 1 mass % or less. Even more preferably, the first processing liquid 210 may be made of the chelating agent 211 and the solvent 212. The first processing liquid 210 is an example of a chemical liquid.

Examples of the second processing liquid 220 may include a processing liquid having an action of reacting the surface of the metal film 110 with the chelating agent 211 to generate the complex 213. Examples of the second processing liquid 220 may include deionized water (DIW). The second processing liquid 220 may be an aqueous solution in which a pH adjuster such as ammonia ($NH_3$) or carbon dioxide ($CO_2$) is dissolved in DIW. In order to suppress etching of the metal film 110 by the second processing liquid 220, the pH of the second processing liquid 220 may be 7 or more.

Examples of the third processing liquid 230 may include IPA. IPA may be desired because it is easily dissolved in the second processing liquid 220 containing water. The same liquid (or component) may be used for the solvent 212 and the third processing liquid 230, and the liquid (or component) of the solvent 212 and the liquid (or component) of the third processing liquid 230 may be different.

Examples of the fourth processing liquid may include an aqueous solution (SC1 liquid) of $NH_4OH$ (ammonium hydroxide) and $H_2O_2$ (hydrogen peroxide), or dilute hydrofluoric acid (DHF). Warmed IPA may be used as the fourth processing liquid.

2. Configuration of Substrate Processing System

Figure 3:
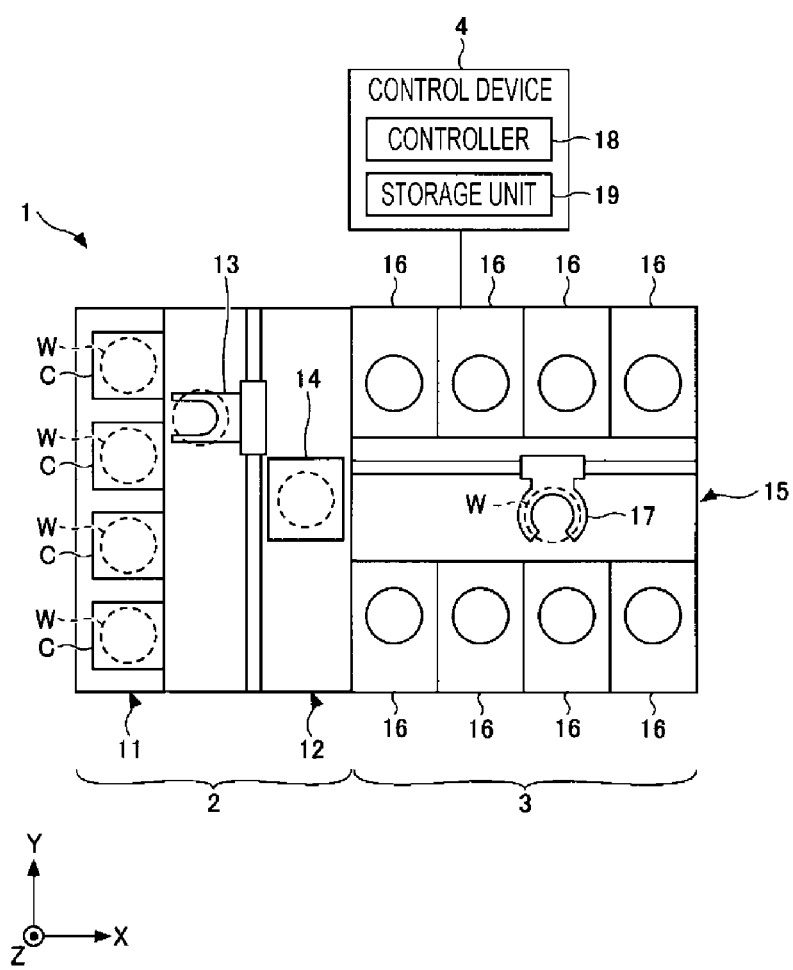
FIG. 3 is a diagram illustrating a schematic configuration of a substrate processing system according to the embodiment.

Next, a configuration of a substrate processing system which executes the above-described substrate processing method will be described with reference to FIG. 3. FIG. 3 is a diagram illustrating a schematic configuration of a substrate processing system according to the embodiment. In the following, in order to clarify positional relationships, the X-axis, Y-axis, and Z-axis which are orthogonal to each other will be defined, and the positive Z-axis direction will be regarded as a vertically upward direction.

As illustrated in FIG. 3, the substrate processing system 1 includes a carry-in/out station 2 and a processing station 3. The carry-in/out station 2 and the processing station 3 are provided adjacent to each other.

The carry-in/out station 2 includes a carrier placing section 11 and a transfer section 12. In the carrier placing section 11, a plurality of carriers C are placed to accommodate a plurality of wafers W horizontally.

As described above, the interlayer insulating film 120 is formed on the surface of the wafer W, and the metal film 110 is formed in the recess 121 such as a wiring groove or via hole formed in the surface of the interlayer insulating film 120.

The transfer section 12 is provided adjacent to the carrier placing section 11, and includes a substrate transfer device 13 and a delivery unit 14. The substrate transfer device 13 includes a wafer holding mechanism configured to hold the wafer W. Further, the substrate transfer device 13 is movable horizontally and vertically and pivotable around a vertical axis, and transfers the wafer W between the carriers C and the delivery unit 14 by using the wafer holding mechanism.

The processing station 3 is provided adjacent to the transfer section 12. The processing station 3 includes a transfer section 15 and a plurality of etching units 16. The plurality of etching units 16 are arranged at both sides of the transfer section 15. The number of etching units 16 is not limited to the example illustrated in FIG. 3.

The transfer section 15 includes a substrate transfer device 17 therein. The substrate transfer device 17 includes a wafer holding mechanism configured to hold the wafer W. Further, the substrate transfer device 17 is movable horizontally and vertically and pivotable around a vertical axis, and transfers the wafer W between the delivery unit 14 and the etching units 16 by using the wafer holding mechanism.

The etching units 16 perform a predetermined substrate processing on the wafers W transferred by the substrate transfer device 17.

Further, the substrate processing system 1 includes a control device 4. The control device 4 includes a controller 18 and a storage unit 19.

The controller 18 includes, for example, a microcomputer having a central processing unit (CPU), a read only memory (ROM), a random access memory (RAM), and input and output ports, or various circuits. The controller 18 controls the operations of the substrate processing system 1 as the CPU executes a program stored in the ROM by using the RAM as a work area.

The program may be recorded in a computer-readable storage medium and installed from the storage medium to the storage unit 19 of the control device 4. The computer-readable storage medium may be, for example, a hard disk (HD), a flexible disk (FD), a compact disk (CD), a magnet optical disk (MO), or a memory card.

The storage unit 19 is implemented by, for example, a semiconductor memory device such as a RAM or a flash memory, or a storage device such as a hard disk or an optical disk.

3. Configuration of Etching Unit

Figure 4:
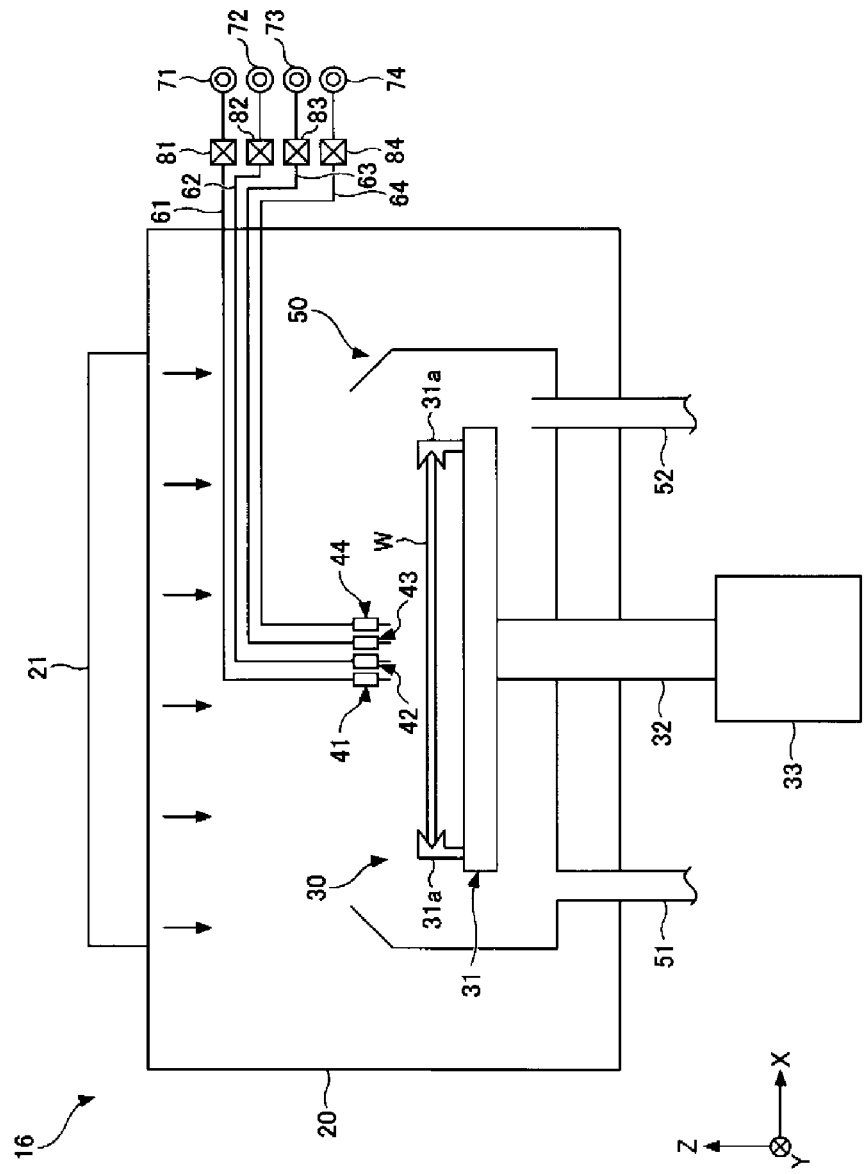
FIG. 4 is a diagram illustrating a schematic configuration of an etching unit.

Next, a configuration of the etching unit 16 will be described with reference to FIG. 4. FIG. 4 is a diagram illustrating a schematic configuration of the etching unit 16.

As illustrated in FIG. 4, the etching unit 16 includes a chamber 20, a substrate holding mechanism 30, a first supply 41, a second supply 42, a third supply 43, a fourth supply 44, and a recovery cup 50.

The chamber 20 accommodates the substrate holding mechanism 30, the first supply 41, the second supply 42, the third supply 43, the fourth supply 44, and the recovery cup 50. A fan filter unit (FFU) 21 is provided on the ceiling of the chamber 20. The FFU 21 forms a downflow in the chamber 20.

The substrate holding mechanism 30 includes a holder 31, a support 32, and a drive 33. The holder 31 holds the wafer W horizontally. The wafer W is held by the holder 31 with the surface thereof on which the metal film 110 is formed facing upward.

In the present embodiment, the holder 31 includes a plurality of grippers 31a and holds the wafer W by gripping the peripheral edge portion of the wafer W using the plurality of grippers 31a, but is not limited to this. The holder 31 may be, for example, a vacuum chuck that sucks and holds the wafer W.

The support 32 is a vertically extending member, and has a base end portion supported rotatably by the drive 33 and a tip end portion supporting the holder 31 horizontally. The drive 33 rotates the support 32 around the vertical axis. The substrate holding mechanism 30 rotates the holder 31 supported on the support 32 by rotating the support 32 using the drive 33, thereby rotating the wafer W held in the holder 31.

The first supply 41, the second supply 42, the third supply 43, and the fourth supply 44 are arranged above the wafer W held in the holder 31.

One end of a first supply path 61 is connected to the first supply 41, and the other end of the first supply path 61 is connected to a first supply source 71 of the first processing liquid 210. A first flow rate adjusting valve 81 capable of adjusting an opening/closing operation of the first supply path 61 and the supply flow rate of the first processing liquid 210 is inserted in the middle of the first supply path 61. Thus, when the first flow rate adjusting valve 81 is opened, the first processing liquid 210 is supplied from the first supply 41 to the wafer W held in the holder 31. Thus, the first processing liquid 210 is supplied to the metal film 110 on the wafer W.

One end of a second supply path 62 is connected to the second supply 42, and the other end of the second supply path 62 is connected to a second supply source 72 of the second processing liquid 220. A second flow rate adjusting valve 82 capable of adjusting an opening/closing operation of the second supply path 62 and the supply flow rate of the second processing liquid 220 is inserted in the middle of the second supply path 62. Thus, when the second flow rate adjusting valve 82 is opened, the second processing liquid 220 is supplied from the second supply 42 to the wafer W held in the holder 31. Thus, the second processing liquid 220 is supplied to the metal film 110 on the wafer W.

One end of a third supply path 63 is connected to the third supply 43, and the other end of the third supply path 63 is connected to a third supply source 73 of the third processing liquid 230. A third flow rate adjusting valve 83 capable of adjusting an opening/closing operation of the third supply path 63 and the supply flow rate of the third processing liquid 230 is inserted in the middle of the third supply path 63. Thus, when the third flow rate adjusting valve 83 is opened, the third processing liquid 230 is supplied from the third supply 43 to the wafer W held in the holder 31. Thus, the third processing liquid 230 is supplied to the metal film 110 on the wafer W.

One end of a fourth supply path 64 is connected to the fourth supply 44, and the other end of the fourth supply path 64 is connected to a fourth supply source 74 of the fourth processing liquid. A fourth flow rate adjusting valve 84 capable of adjusting an opening/closing operation of the fourth supply path 64 and the supply flow rate of the fourth processing liquid is inserted in the middle of the fourth supply path 64. Thus, when the fourth flow rate adjusting valve 84 is opened, the fourth processing liquid is supplied from the fourth supply 44 to the wafer W held in the holder 31. Thus, the fourth processing liquid is supplied to the metal film 110 on the wafer W.

The recovery cup 50 is disposed so as to surround the holder 31, and collects the first processing liquid 210, the second processing liquid 220, the third processing liquid 230, or the fourth processing liquid scattered from the wafer W by the rotation of the holder 31. A drain port 51 is formed in the bottom of the recovery cup 50, and the first processing liquid 210, the second processing liquid 220, the third processing liquid 230, or the fourth processing liquid collected by the recovery cup 50 is discharged from the drain port 51 to the outside of the etching unit 16. Further, an exhaust port 52 is formed in the bottom of the recovery cup 50 to discharge a gas supplied from the FFU 21 to the outside of the etching unit 16.

For example, when the metal film 110 is a cobalt film, i.e., when the target metal is cobalt, the first processing liquid 210, the second processing liquid 220, the third processing liquid 230, and the fourth processing liquid may be used as follows. For example, the first processing liquid 210 contains citric acid or oxalic acid as a chelating agent and IPA as a solvent. For example, the second processing liquid 220 is DIW, the third processing liquid 230 is IPA, and the fourth processing liquid is an SC1 liquid or DHF. The pH of DIW as the second processing liquid 220 may be adjusted to more than 7 by a pH adjuster such as $NH_3$.

4. Specific Operation of Substrate Processing System

Figure 5:
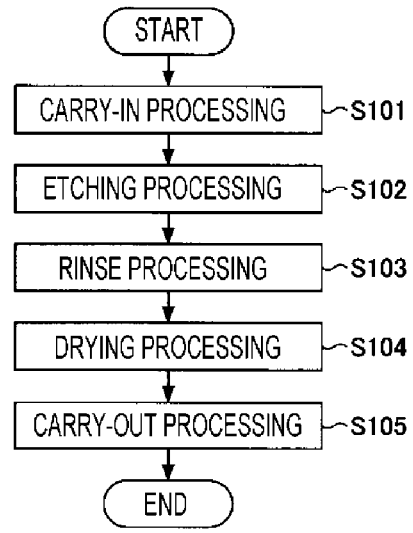
FIG. 5 is a flowchart illustrating a sequence of a substrate processing executed by the substrate processing system.

Next, a specific operation of the substrate processing system 1 will be described with reference to FIG. 5. FIG. 5 is a flowchart illustrating a sequence of a substrate processing executed by the substrate processing system. Each device included in the substrate processing system 1 executes each processing sequence illustrated in FIG. 5 under the control of the controller 18.

As illustrated in FIG. 5, in the substrate processing system 1, first, the wafer W is carried into the etching unit 16 (step S101). Specifically, the substrate transfer device 13 of the carry-in/out station 2 takes out the wafer W from the carrier C placed on the carrier placing section 11, and places the taken-out wafer W on the delivery unit 14. The wafer W placed on the delivery unit 14 is taken out from the delivery unit 14 by the substrate transfer device 17 of the processing station 3 and is carried into the etching unit 16. The wafer W carried into the etching unit 16 is held by the holder 31 of the etching unit 16.

Subsequently, in the substrate processing system 1, an etching processing is performed (step S102). In the etching processing, the processing liquids are supplied from the first supply 41, the second supply 42, the third supply 43, and the fourth supply 44 to the wafer W held in the holding unit 31 while the holding unit 31 holding the wafer W is being rotated by the drive 33. Thus, a part of the metal film 110 on the wafer W is removed.

Figure 6:
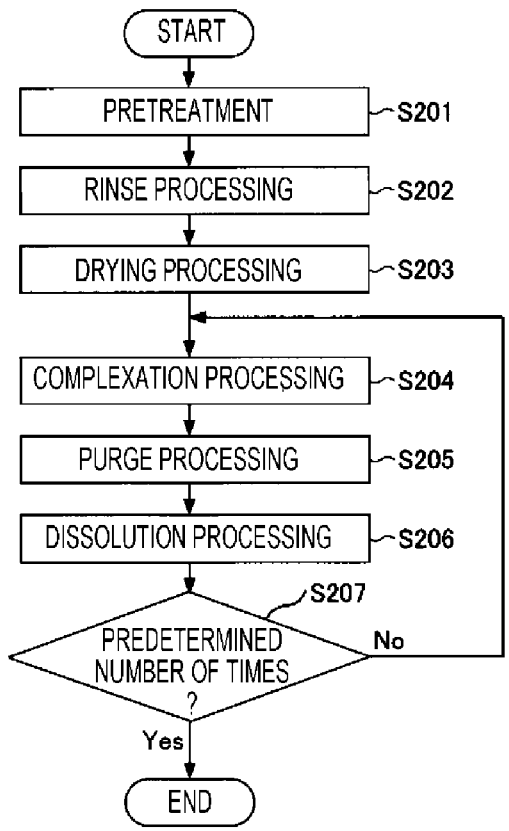
FIG. 6 is a flowchart illustrating a first example of a sequence of an etching processing.
Figure 7:
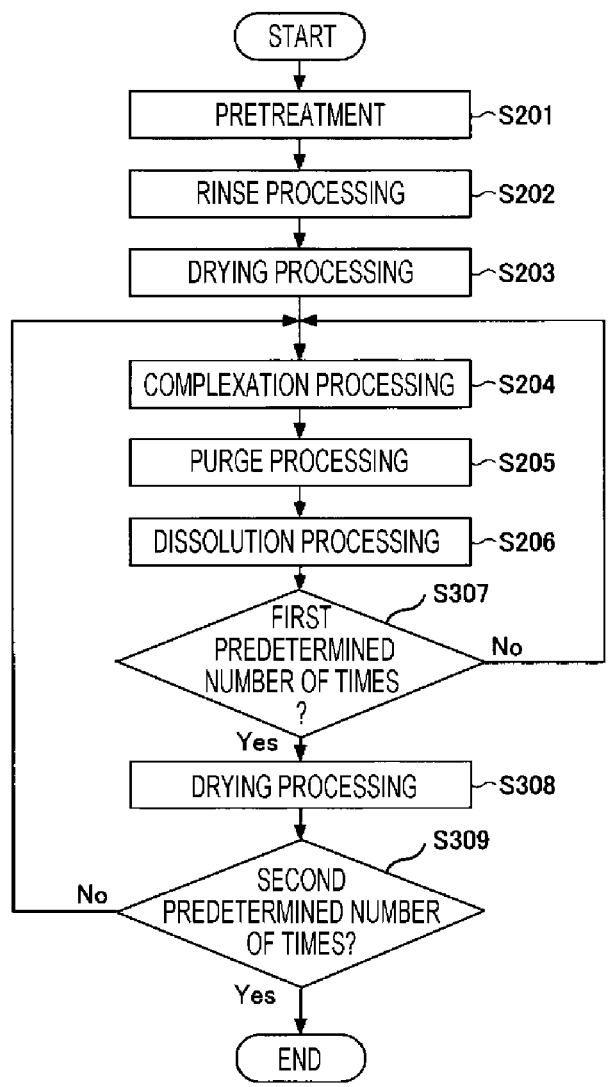
FIG. 7 is a flowchart illustrating a second example of a sequence of an etching processing.

Here, the details of the etching processing will be described. FIG. 6 is a flowchart illustrating a first example of a sequence of an etching processing. FIG. 7 is a flowchart illustrating a second example of a sequence of an etching processing.

In the first example, in the etching processing (step S102), first, a pretreatment is performed (step S201). In the pretreatment, the fourth processing liquid is supplied from the fourth supply 44 to the rotating wafer W, so that foreign substances such as organic matters adhering to the surface of the passivation film 130 are removed by the fourth processing liquid.

Subsequently, a rinse processing is performed (step S202). In the rinse processing, the supply of the fourth processing liquid is stopped, and a rinse liquid is supplied to the rotating wafer W. Thus, the fourth processing liquid remaining on the wafer W is removed. The rinse liquid is, for example, DIW. When the second processing liquid 220 is DIW, the second processing liquid 220 may be used as the rinse liquid. When the second processing liquid 220 contains, for example, a pH adjuster in addition to DIW, a fifth supply connected to a DIW supply source may be provided in the etching unit 16 to supply DIW as the rinse liquid from the fifth supply.

Thereafter, a drying processing is performed (step S203). In the drying processing, the supply of the rinse liquid is stopped while continuing the rotation of the wafer W. Thus, the rinse liquid remaining on the wafer W is removed, and the wafer W is dried. During the drying processing, a natural oxide film is formed on the surface of the metal film 110 as the passivation film 130 containing the oxide 131 (see FIG. 2A).

Subsequently, a complexation processing is performed (step S204). In the complexation processing, the first processing liquid 210 containing the chelating agent 211 and the solvent 212 is supplied from the first supply 41 to the rotating wafer W to generate the complex 213 containing the oxide 131 and the chelating agent 211 (see FIG. 2B). The drying processing (step S203) may be omitted, and the rinse processing (step S202) may be followed by the complexation processing (step S204).

Subsequently, a purge processing is performed (step S205). In the purge processing, the supply of the first processing liquid 210 is stopped, and the third processing liquid 230 is supplied from the third supply 43 to the rotating wafer W to remove the chelating agent 211 which did not adhere to the oxide 131 and the solvent 212 and to form a liquid film of the third processing liquid 230 (see FIG. 2C).

Thereafter, a dissolution processing is performed (step S206). In the dissolution processing, the supply of the third processing liquid 230 is stopped, and the second processing liquid 220 is supplied from the second supply 42 to the rotating wafer W to dissolve the complex 213 in the second processing liquid 220 and remove the complex 213 from the metal film 110 and to form the new passivation film 130 by dissolved oxygen in the second processing liquid 220 (see FIGS. 2D and 2E).

Then, the processings of steps S204 to S206 are repeated, and the etching processing (step S102) is completed when the number of repetitions reaches a predetermined number of times (step S207).

After the etching processing (step S102), the rinse processing is performed in the substrate processing system 1 (step S103). In the rinse processing, the supply of the second processing liquid 220 is stopped, and the rinse liquid is supplied to the rotating wafer W. Thus, the second processing liquid 220 remaining on the wafer W is removed. When the second processing liquid 220 is DIW, the rinse processing (step S103) may be omitted.

Subsequently, in the substrate processing system 1, a drying processing is performed (step S104). In the drying processing, the supply of the rinse liquid is stopped while continuing the rotation of the wafer W. Thus, the rinse liquid remaining on the wafer W is removed and the wafer W is dried. IPA may be used to assist in drying.

Subsequently, in the substrate processing system 1, a carry-out processing is performed (step S105). In the carry-out processing, the wafer W after the drying processing is carried out from the etching unit 16 by the substrate transfer device 17, and is placed on the delivery unit 14. Then, the completely processed wafer W placed on the delivery unit 14 is returned to the carrier C of the carrier placing section 11 by the substrate transfer device 13. Thus, a series of substrate processings for one wafer W is completed.

In the second example, first, the processings from the pretreatment (step S201) to the dissolution processing (step S206) are performed as in the first example.

Then, the processings of steps S204 to S206 are repeated, and a drying processing (step S308) is performed when the number of repetitions reaches a first predetermined number of times (step S307). In the drying processing, the supply of the second processing liquid 220 used in the dissolution processing is stopped while continuing the rotation of the wafer W. Thus, the second processing liquid 220 remaining on the wafer W is removed, and the wafer W is dried. The passivation film 130 formed in the dissolution processing remains as it is.

Then, the repetition of the processings of steps S204 to S206 and the drying processing of step S308 are repeated, and the etching processing (step S102) is completed when the number of repetitions reaches a second predetermined number of times (step S309).

For example, the first predetermined number of times is 10 times to 50 times, and the second predetermined number of times is 3 times to 10 times. When the first predetermined number of times is 40 times and the second predetermined number of times is 5 times, the processings of steps S204 to S206 are first repeated 40 times, and then the drying processing of step S308 is performed. The processings of steps S204 to S206 repeated 40 times and the drying processing of step S308 are set to one set, and this set is repeated 5 times.

The first predetermined number of times may change during the etching processing of step S102. In this case, the first predetermined number of times may decrease as the number of repetitions of the repetition of the processings of steps S204 to S206 and the drying processing of step S308 increases. For example, when the second predetermined number of times is 5 times, the first predetermined number of times may be 40 times while the number of repetitions of the repetition of the processings of steps S204 to S206 and the drying processing of step S308 is up to 3 times, and may be 30 times during the remaining number of repetitions of 2 times. In the later stage of the etching processing, a height difference between the surface of the metal film 110 and the surface of the interlayer insulating film 120 increases, so that it is difficult to replace the second processing liquid 220 with the first processing liquid 210 in step S204, which may make it difficult to generate the complex 213. Meanwhile, by reducing the first predetermined number of times in the later stage of the etching processing to increase the frequency of the drying processing of step S308, the second processing liquid 220 may be removed before step S204 to maintain ease in the generation of the complex 213 in step S204.

When a liquid film of the second processing liquid 220 is formed on the entire surface of the wafer W in the dissolution processing (step S206), the controller 18 may stop the supply of the second processing liquid 220 by the second supply 42 while continuing the rotation of the wafer W. As described above, the new passivation film 130 is formed on the surface of the metal film 110 with the supply of the second processing liquid 220. At this time, when the metal film 110 is exposed to the second processing liquid 220 for a long time, the newly generated oxide 131 may be dissolved in the second processing liquid 220. When the newly generated oxide 131 is dissolved in the second processing liquid 220, it may be difficult to remove the metal film 110 by each layer of the metal atoms 111.

The timing at which the supply of the second processing liquid 220 by the second supply 42 is stopped may not completely coincide with the timing at which the formation of the liquid film is completed. For example, assuming that the time from the start of the supply of the second processing liquid 220 to the completion of the formation of the liquid film is t, the supply of the second processing liquid 220 may be stopped when the time of 1.0 t or more and 1.1 t or less has passed from the start of the supply of the second processing liquid 220.

The controller 18 may control the temperature of the second processing liquid 220 to 25° C. or lower. This is because the newly generated oxide 131 is easily dissolved in the second processing liquid 220 when the temperature of the second processing liquid 220 is more than 25° C. For example, the controller 18 controls the temperature of the second processing liquid 220 to 20° C. or more and 25° C. or less which is about room temperature. The controller 18 may control the temperature of the third processing liquid 230 to the same degree as the temperature of the second processing liquid 220. This is to suppress a change in the temperature of the second processing liquid 220 supplied to the wafer W.

The controller 18 may control the concentration of dissolved oxygen in the second processing liquid 220 to 600 ppb or less, and more particularly to 500 ppb or less. This is because the passivation film 130 may be excessively formed when the concentration of dissolved oxygen in the second processing liquid 220 exceeds 600 ppb. Meanwhile, it is extremely difficult to reduce the concentration of dissolved oxygen to less than 100 ppb. Further, when the concentration of dissolved oxygen is too low, it may be difficult to form the new passivation film 130. Thus, the controller 18 sets the concentration of dissolved oxygen in the second processing liquid 220 to 100 ppb or more and 600 ppb or less.

The controller 18 may control the pH of the second processing liquid 220 according to the type of the target metal. A pH adjuster may be used to control the pH. By controlling the pH of the second processing liquid 220, the etching of the passivation film 130 by the second processing liquid 220 such as DIW may be suppressed. For example, when the target metal is cobalt or copper, $NH_3$ may be used as the pH adjuster.

As described above, the substrate processing system 1 (an example of the substrate processing apparatus) according to the embodiment includes the substrate holding mechanism 30 (an example of the substrate rotator), the first supply 41, the second supply 42, and the controller 18. The substrate holding mechanism 30 holds and rotates the wafer W (an example of the substrate) having the metal film 110 formed on the surface thereof. The first supply 41 supplies the first processing liquid 210 containing the chelating agent 211 and the solvent 212 toward the wafer W. The second supply 42 supplies the second processing liquid 220 containing water toward the wafer W. The controller 18 controls the substrate holding mechanism 30, the first supply 41, and the second supply 42. The controller 18 supplies the first processing liquid 210 toward the wafer W by the first supply 41 to generate the complex 213 containing a metal constituting the metal film 110 and the chelating agent 211 while rotating the wafer W by the substrate holding mechanism 30, and after the generation of the complex 213, supplies the second processing liquid 220 toward the wafer W by the second supply 42 to dissolve the complex 213 in the second processing liquid 220.

Accordingly, with the substrate processing system 1 according to the embodiment, it is possible to suppress the surface roughness of the metal film 110 after etching.

The target metal is not limited to cobalt (Co) and copper (Cu). For example, the target metal may be ruthenium (Ru), molybdenum (Mo), or titanium nitride (TiN).

The substrate processing system 1 may be provided with a first tank which stores the first processing liquid 210 and a second tank which mixes the chelating agent and the solvent, and the chelating agent and the solvent may be supplied to the second tank from a supply source of the chelating agent and a supply source of the solvent, respectively. In this case, the chelating agent and the solvent are mixed in the second tank, and a mixed liquid of the chelating agent and the solvent is sent from the second tank to the first tank as the first processing liquid 210, so that the first processing liquid 210 is supplied from the first tank to the first supply 41.

According to the present disclosure, it is possible to suppress the surface roughness of a metal film after etching.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
   supplying a first processing liquid containing a chelating agent and a solvent from a first tank toward a substrate having a film of a metal formed on a surface thereof to generate a complex containing the metal and the chelating agent while rotating the substrate; and
   supplying a second processing liquid containing water and oxygen toward the substrate to dissolve the complex in the second processing liquid while rotating the substrate, after the complex is generated,
   wherein a concentration of the oxygen is controlled by a controller.

2. The substrate processing method according to claim 1, wherein the supplying the second processing liquid includes stopping the supply of the second processing liquid when a liquid film of the second processing liquid is formed on an entire surface of the substrate.

3. The substrate processing method according to claim 1, wherein the supplying the first processing liquid and the supplying the second processing liquid are repeated.

4. The substrate processing method according to claim 1, further comprising:
   supplying a third processing liquid that is water soluble toward the substrate to remove the chelating agent remaining on the substrate after the complex is generated and before the second processing liquid is supplied.

5. The substrate processing method according to claim 1, wherein a temperature of the second processing liquid is controlled to 25° C. or less.

6. The substrate processing method according to claim 1, further comprising:
   supplying a fourth processing liquid capable of removing a foreign substance adhering to a surface of the film of the metal toward the substrate while rotating the substrate before the first processing liquid is supplied.

7. The substrate processing method according to claim 1, further comprising:
   continuously rotating the substrate to dry the surface of the substrate after the second processing liquid is supplied.

8. The substrate processing method according to claim 1, wherein
   the first processing liquid and the second processing liquid are supplied alternately for a first number of times, respectively, while rotating the substrate,
   after the alternate supplying of the first processing liquid and the second processing liquid, a first drying is performed on the surface of the substrate while continuing the rotation of the substrate, and
   the alternate supplying and the first drying are repeated for a second number of times.

9. The substrate processing method according to claim 8, wherein the first number of times of the alternate supplying is reduced as the number of the alternate supplying and the first drying increases.

10. The substrate processing method according to claim 1, wherein the first processing liquid further includes water and a content of water is 10 mass % or less.

11. The substrate processing method according to claim 1, wherein the metal includes one or more selected from a group consisting of Cu, Co, Ru, Mo, and TiN,
   the chelating agent contains an organic acid containing at least one selected from a group consisting of a carbonyl group, a carboxyl group, and an amine group, and
   the solvent contains one or more selected from a group consisting of isopropyl alcohol, acetone, N-methyl-2-pyrrolidone, and tetrahydrofuran.

* * * * *